(12) United States Patent
Cheng et al.

(10) Patent No.: US 9,660,028 B1
(45) Date of Patent: May 23, 2017

(54) STACKED TRANSISTORS WITH DIFFERENT CHANNEL WIDTHS

(71) Applicant: International Business Machines Corporation, Armonk, NY (US)

(72) Inventors: Kangguo Cheng, Schenectady, NY (US); Lawrence A. Clevenger, Rhinebeck, NY (US); Balasubramanian S. Pranatharthiharan, Watervliet, NY (US); John Zhang, Altamont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/339,665

(22) Filed: Oct. 31, 2016

(51) Int. Cl.
| | |
|---|---|
| *H01L 29/06* | (2006.01) |
| *H01L 29/66* | (2006.01) |
| *H01L 29/08* | (2006.01) |
| *H01L 21/306* | (2006.01) |
| *H01L 29/423* | (2006.01) |
| *H01L 21/02* | (2006.01) |
| *H01L 29/786* | (2006.01) |
| *H01L 29/78* | (2006.01) |

(52) U.S. Cl.
CPC .... *H01L 29/0673* (2013.01); *H01L 21/02532* (2013.01); *H01L 21/30604* (2013.01); *H01L 29/0847* (2013.01); *H01L 29/42392* (2013.01); *H01L 29/6653* (2013.01); *H01L 29/6656* (2013.01); *H01L 29/66545* (2013.01); *H01L 29/66742* (2013.01); *H01L 29/66795* (2013.01); *H01L 29/785* (2013.01); *H01L 29/786* (2013.01)

(58) Field of Classification Search
CPC combination set(s) only.
See application file for complete search history.

(56) References Cited

U.S. PATENT DOCUMENTS

| 9,287,357 | B2 | 3/2016 | Rodder et al. |
|---|---|---|---|
| 2012/0292665 | A1 | 11/2012 | Marino et al. |
| 2015/0123215 | A1 | 5/2015 | Obradovic et al. |
| 2015/0364542 | A1 | 12/2015 | Rodder et al. |
| 2016/0071729 | A1 | 3/2016 | Hatcher et al. |
| 2016/0111284 | A1 | 4/2016 | Kittl et al. |
| 2016/0111337 | A1 | 4/2016 | Hatcher et al. |
| 2016/0126310 | A1 | 5/2016 | Rodder et al. |
| 2016/0163796 | A1 | 6/2016 | Obradovic et al. |

FOREIGN PATENT DOCUMENTS

| CN | 105679827 A | 6/2016 |
|---|---|---|
| KR | 1020160068680 A | 6/2016 |

*Primary Examiner* — Matthew Reames
*Assistant Examiner* — John Bodnar
(74) *Attorney, Agent, or Firm* — Cantor Colburn LLP; David Quinn

(57) ABSTRACT

A semiconductor device includes a first gate stack arranged about a first nanowire and a second nanowire, the first nanowire is arranged above a second nanowire, the first nanowire is connected to a first source/drain region and a second source/drain region. A second gate stack is arranged about a third nanowire and a fourth nanowire, the third nanowire is arranged above a fourth nanowire, the third nanowire is connected to a third source/drain region and a fourth source/drain region. An insulator layer having a first thickness is arranged adjacent to the first gate stack.

16 Claims, 22 Drawing Sheets

STACKED TRANSISTORS WITH DIFFERENT CHANNEL WIDTHS

BACKGROUND

The present invention generally relates to complimentary metal-oxide semiconductors (CMOS) and metal-oxide-semiconductor field-effect transistors (MOSFET), and more specifically, to nanowire device fabrication.

The MOSFET is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET includes n-doped source and drain junctions and uses electrons as the current carriers. The pFET includes p-doped source and drain junctions and uses holes as the current carriers.

Nanowire devices are gate-all-around devices that include channel regions formed from semiconductor nanowires. The channel regions formed from semiconductor nanowires. The gate stacks conform around the nanowires to form a gate-all-around device. The nanowire devices are often formed using a fabrication process that uses nanosheets to form nanosheet fins. The nanosheet fins can be formed into nanowires in the channel regions of the devices.

SUMMARY

According to an embodiment of the present invention a method for forming a semiconductor device includes forming a stack of nanowires/nanosheets on a substrate, the stack of nanosheets comprising a first layer of a first nanosheet material arranged on the substrate and a second layer of a second nanosheet material arranged on the first layer, a third layer of the first nanosheet material arranged on the second layer, and a fourth layer of the second nanosheet material arranged on the third layer. Portions of the stack of nanosheets are removed to form a nanosheet fin on the substrate. A first sacrificial gate is formed on a first channel region of the nanosheet fin and a second sacrificial gate is formed on a second channel region of the nanosheet fin. A first sacrificial spacer is formed along sidewalls of the first sacrificial gate and the second sacrificial gate. Exposed portions of the nanosheet fin are removed. Portions of the first nanosheet material are removed to form cavities in the nanosheet fin, and the cavities are filled with a second sacrificial spacer. The first sacrificial spacer is removed from along the sidewalls of the first sacrificial gate and the second sacrificial gate. An insulator material is deposited over the substrate and the sidewalls of the first sacrificial gate and the second sacrificial gate. Portions of the insulator material are removed to form a spacer adjacent to sidewalls of the first sacrificial gate and the second sacrificial gate, and to expose the fourth layer and the third layer. Portions of the insulator material are removed to expose portions of the second layer and the first layer, the exposed portions of the second layer, and the first layer arranged under the second sacrificial gate. Source/drain regions are formed adjacent to the first sacrificial gate and the second sacrificial gate, and a gate stack is formed over the first channel region and the second channel region.

According to another embodiment of the present invention, a method for forming a semiconductor device includes forming a stack of nanosheets on a substrate, the stack of nanosheets comprising a first layer of a first nanosheet material arranged on the substrate and a second layer of a second nanosheet material arranged on the first layer, a third layer of the first nanosheet material arranged on the second layer, a fourth layer of the second nanosheet material arranged on the third layer, a fifth layer of the first nanosheet material arranged on the fourth layer and a sixth layer of the second nanosheet material arranged on the fifth layer. Portions of the stack of nanosheets are removed to form a nanosheet fin on the substrate. A first sacrificial gate is formed on a first channel region of the nanosheet fin, a second sacrificial gate is formed on a second channel region of the nanosheet fin, and a third sacrificial gate is formed on a third channel region of the nanosheet fin. A first sacrificial spacer is formed along sidewalls of the first sacrificial gate, the second sacrificial gate, and the third sacrificial gate. Exposed portions of the nanosheet fin are removed, and portions of the first nanosheet material are removed to form cavities in the nanosheet fin. The cavities are filled with a second sacrificial spacer. The first sacrificial spacer is removed from along the sidewalls of the first sacrificial gate, the second sacrificial gate, and the third sacrificial gate. An insulator material is deposited over the substrate and the sidewalls of the first sacrificial gate, the second sacrificial gate, and the third sacrificial gate. Portions of the insulator material are removed to form a spacer adjacent to sidewalls of the first sacrificial gate, the second sacrificial gate, and the third sacrificial gate, and to expose the sixth layer and the fifth layer. Portions of the insulator material are removed to expose portions of the fourth layer and the third layer, the exposed portions of the fourth layer, and the third layer arranged under the second sacrificial gate and the third sacrificial gate. Portions of the insulator material are removed to expose portions of the second layer and the first layer, the exposed portions of the second layer, and the first layer arranged under the third sacrificial gate. Source/drain regions are formed adjacent to the first sacrificial gate, the second sacrificial gate, and the third sacrificial gate. A gate stack is formed over the first channel region, the second channel region, and the third channel region.

According to yet another embodiment of the present invention, a semiconductor device includes a first gate stack arranged about a first nanowire and a second nanowire, the first nanowire is arranged above a second nanowire, the first nanowire is connected to a first source/drain region and a second source/drain region. A second gate stack is arranged about a third nanowire and a fourth nanowire, the third nanowire is arranged above a fourth nanowire, the third nanowire is connected to a third source/drain region and a fourth source/drain region. An insulator layer having a first thickness is arranged adjacent to the first gate stack.

DETAILED DESCRIPTION

As discussed above, nanowire devices can be formed using nanosheets. To increase the gate width of nanowire devices, a number of nanowire channels can be arranged vertically and a gate stack can be formed around the nanowire channels. The number of vertically arranged nanowire channels affects the effective gate width of the device such that each additional nanowire channel increases the effective gate width.

The effective gate width of the devices affects the performance characteristics of the nanowire devices. Embodiments of the present invention provide processes, using sacrificial spacers and block masks, for forming nanowire devices on a single wafer that have different numbers of nanowires arranged substantially vertically in the channel region of the devices to provide nanowire devices on a wafer that have different performance characteristics.

Figure 1:
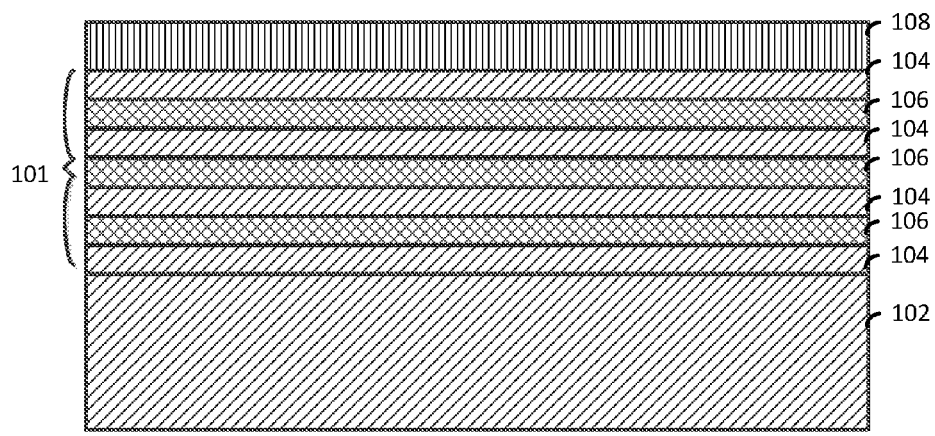
FIG. 1 illustrates a side view of a substrate and a nanosheet stack arranged on the substrate.

FIG. 1 illustrates a side view of a substrate 102 and a nanosheet stack 101 arranged on the substrate 102. The nanosheet stack 101 includes alternating layers of dissimilar materials. In the illustrated embodiment, a nanosheet 104 is arranged on the substrate 102 and a nanosheet 106 is arranged on the nanosheet 104. A second nanosheet 104 is arranged on the nanosheet 106 and a second nanosheet 106 is arranged on the second nanosheet 104 and so on. Any number of layers of nanosheet 104 and 106 can be arranged in such an alternating arrangement to form the nanosheet stack 101.

Non-limiting examples of suitable materials for the semiconductor substrate 102 include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb).

In the illustrated exemplary embodiment the nanosheet 104 includes a semiconductor material such as, for example, Si, Ge, or another suitable semiconductor material. The nanosheet 106 includes a material dissimilar from the nanosheet 106 such as, for example, SiGe.

A hardmask layer 108 is arranged on the nanosheet stack 101. The hardmask 108 can include, for example, silicon oxide, silicon nitride (SiN), SiOCN, SiBCN or any suitable combination of those. The hardmask 108 can be deposited using a deposition process, including, but not limited to, PVD, CVD, PECVD, or any combination thereof.

Figure 2A:
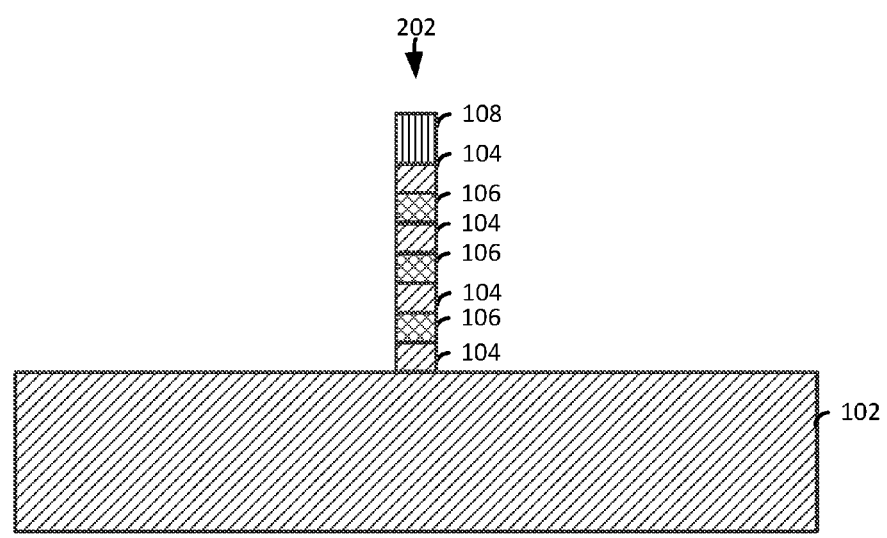
FIG. 2A illustrates a cut-away view along the line A-A (of FIG. 2B) following a lithographic patterning and etching process that removes exposed portions of the hardmask and the nanosheet stack (of FIG. 1) and exposing portions of the substrate to form a nanosheet fin (fin).
Figure 2B:
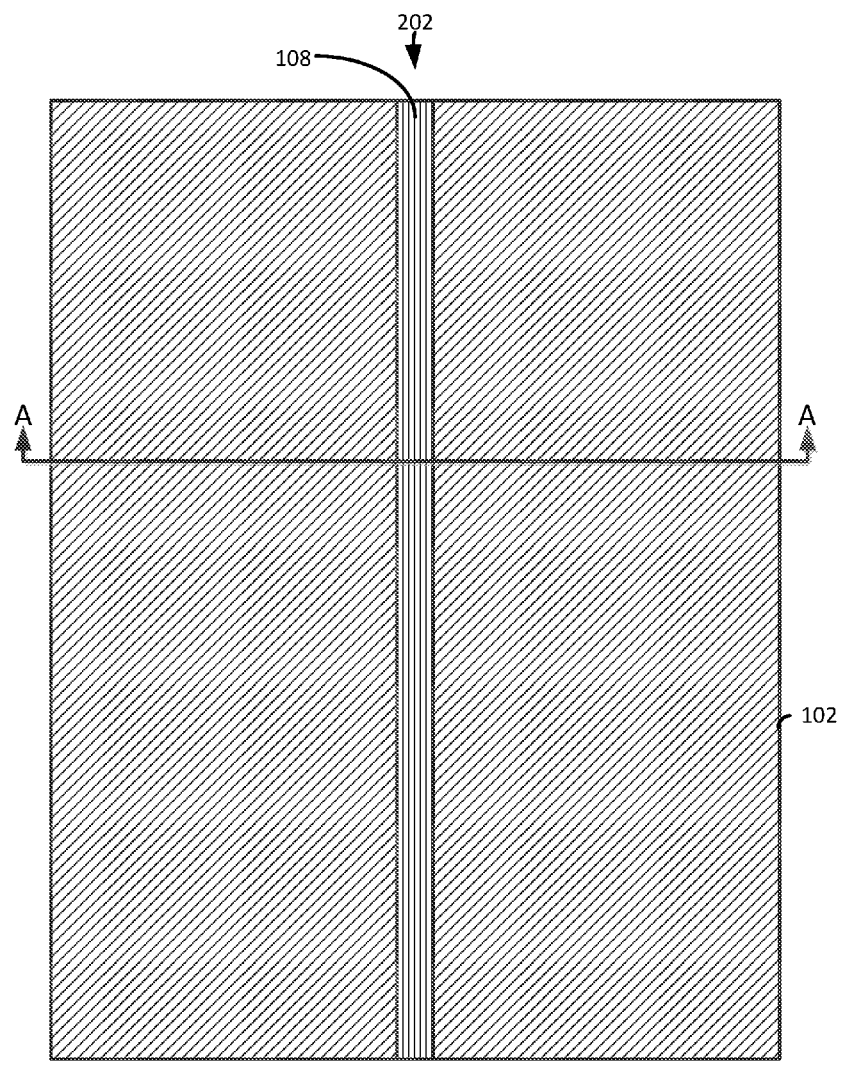
FIG. 2B illustrates a top view of the fin.

FIG. 2A illustrates a cut-away view along the line A-A (of FIG. 2B) following a lithographic patterning and etching process that removes exposed portions of the hardmask 108 and the nanosheet stack 101 (of FIG. 1) and exposing portions of the substrate 102 to form a nanosheet fin (fin) 202. The etching process can include, for example, reactive ion etching. FIG. 2B illustrates a top view of the fin 202.

Figure 3A:
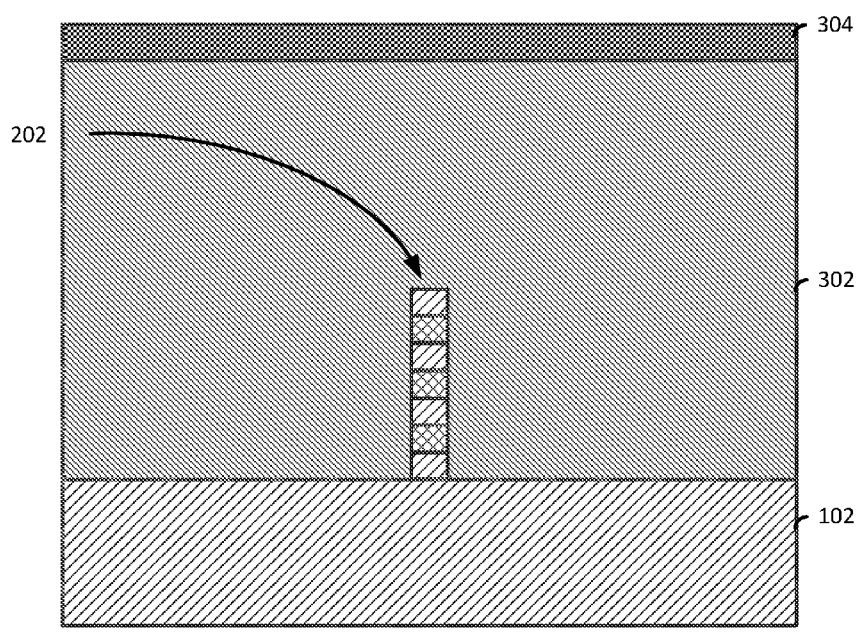
FIG. 3A illustrates a cut-away view along the line A-A (of FIG. 3C).
Figure 3B:
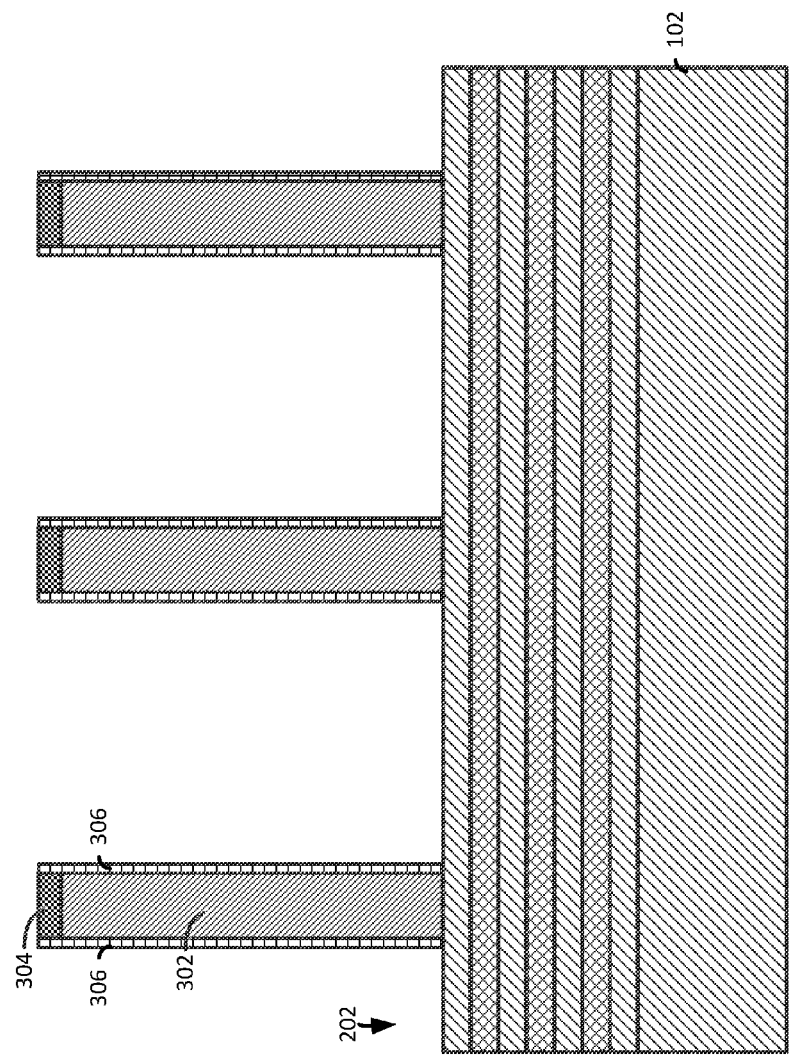
FIG. 3B illustrates a cut-away view along the line B-B (of FIG. 3C).
Figure 3C:
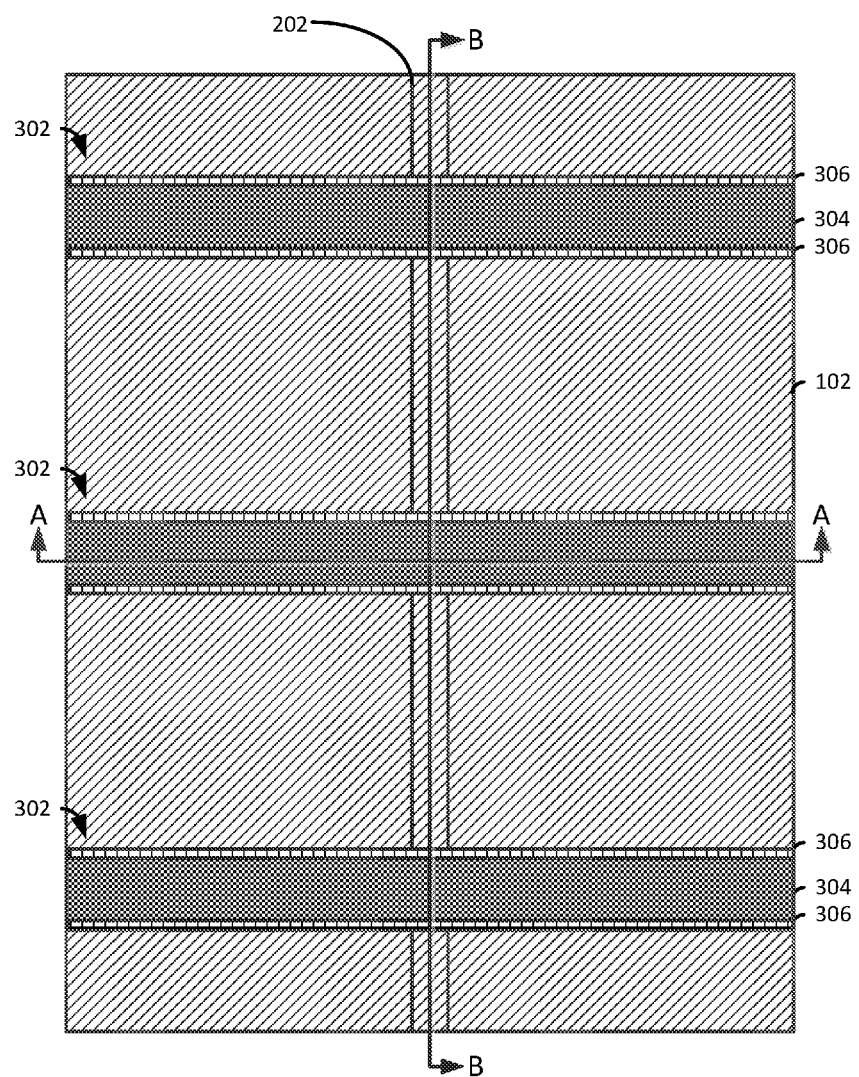
FIG. 3C illustrates a top view following the formation of sacrificial gates and sacrificial spacers adjacent to the sacrificial gates.

FIG. 3A illustrates a cut-away view along the line A-A (of FIG. 3C) and FIG. 3B illustrates a cut-away view along the line B-B (of FIG. 3C), and FIG. 3C illustrates a top view following the formation of sacrificial gates 302 and sacrificial spacers 306 adjacent to the sacrificial gates 302.

The sacrificial gates 302 in the exemplary embodiment are formed by depositing a layer (not shown) of sacrificial gate material such as, for example, amorphous silicon (aSi), or polycrystalline silicon (polysilicon) material or another suitable sacrificial gate material. The sacrificial gate 302 can further include a sacrificial gate dielectric material such as silicon oxide between the nanowires and aSi or polysilicon material.

The layer of sacrificial gate material can be deposited by a deposition process, including, but not limited to, physical vapor deposition (PVD), chemical vapor deposition (CVD), atomic layer deposition (ALD, plasma enhanced chemical vapor deposition (PECVD), inductively coupled plasma chemical vapor deposition (ICP CVD), or any combination thereof.

Following the deposition of the layer of sacrificial gate material, a hard mask layer (not shown) such as, for example, silicon oxide, silicon nitride (SiN), SiOCN, SiBCN or any suitable combination of those materials, is deposited on the layer of sacrificial gate material to form a PC hard mask or sacrificial gate cap 304. The hardmask layer can be deposited using a deposition process, including, but not limited to, PVD, CVD, PECVD, or any combination thereof.

Following the deposition of the layer of sacrificial gate material and the hardmask layer, a patterning and etching process such as, for example, lithography followed by reactive ion etching is performed to remove exposed portions of the hardmask layer and the layer of sacrificial gate material form the sacrificial gates 302 and the sacrificial gate caps 304.

In FIG. 3B, spacers 306 are formed adjacent to the sacrificial gates 302. The spacers 306 in the illustrated embodiment are formed by depositing a layer of spacer material (not shown) over the exposed portions of the fins 202 and the sacrificial gates 302.

Non-limiting examples of suitable materials for the layer of spacer material include dielectric nitrides (e.g., silicon nitride), dielectric oxynitrides, SiBCN, SiOCN, SiOC, dielectric oxides (e.g., silicon oxide), or any combination thereof. The layer of spacer material is deposited by a suitable deposition process, for example, chemical vapor deposition (CVD) or atomic layer deposition (ALD).

Following the deposition of the layer of spacer material, a suitable anisotropic etching process such as, for example, a reactive ion etching process is performed to remove portions of the layer of spacer material and form the spacers 306.

Figure 4A:
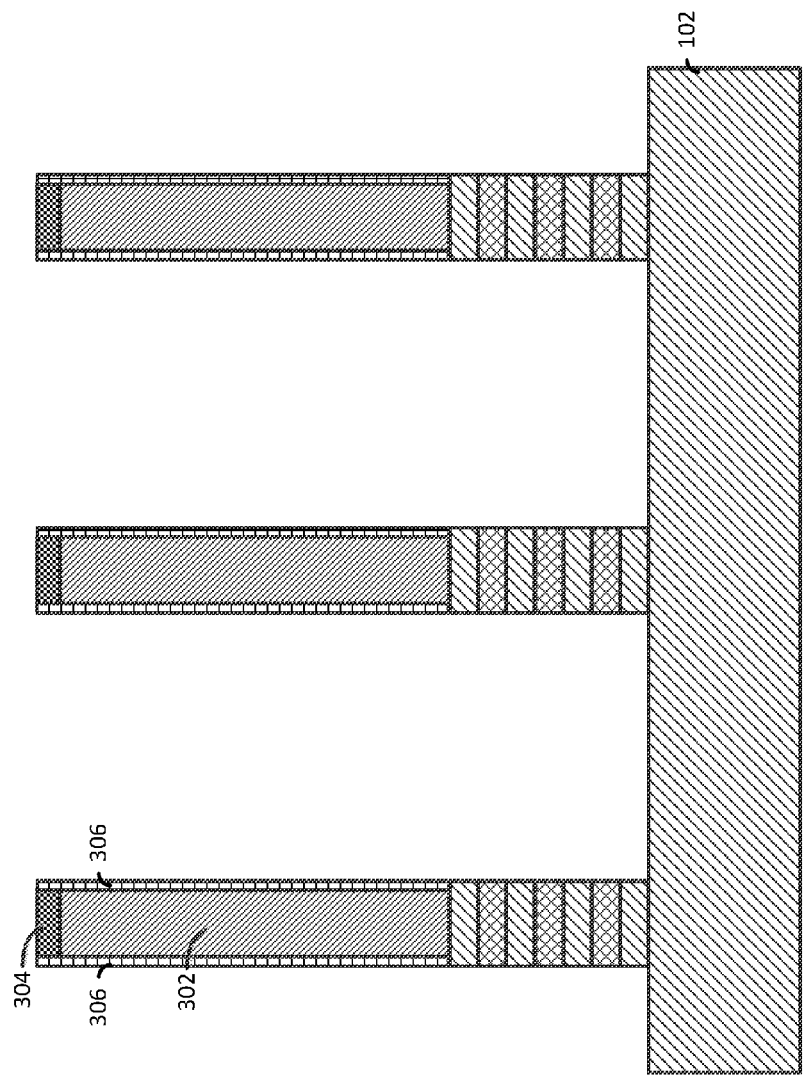
FIG. 4A illustrates a cut-away view along the line B-B (of FIG. 4B) following an etching process that removes exposed portions of the fins (of FIG. 3B).
Figure 4B:
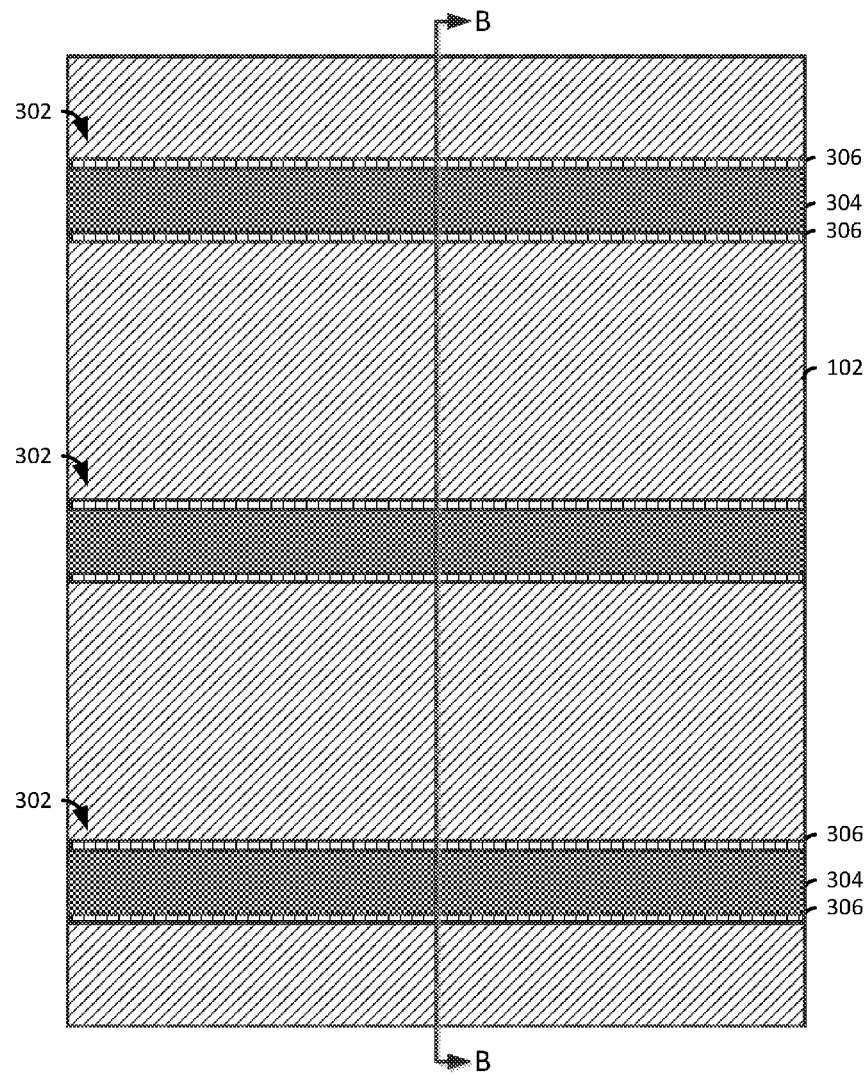
FIG. 4B illustrates a top view following the removal of the exposed portions of the fin.

FIG. 4A illustrates a cut-away view along the line B-B (of FIG. 4B) following an etching process that removes exposed portions of the fins 202 (of FIG. 3B). In this regard, a selective directional or anisotropic etching process such as, for example, reactive ion etching can be performed to remove the exposed portions of the fin 202. FIG. 4B illustrates a top view following the removal of the exposed portions of the fin 202.

Figure 5:
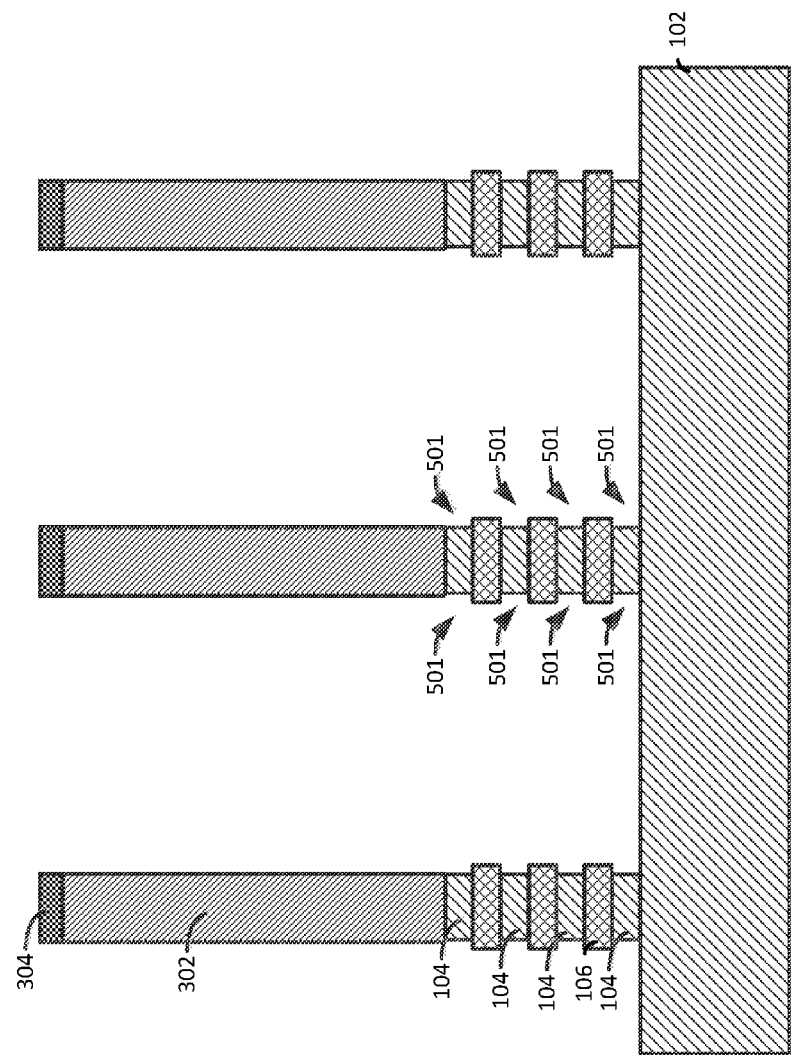
FIG. 5 illustrates a cut-away view following a selective isotropic etching process that removes exposed portions of the nanosheets, which forms cavities.

FIG. 5 illustrates a cut-away view following a selective isotropic etching process that removes exposed portions of the nanosheets 104, which forms cavities 501. The cavities 501 are partially defined by distal ends of the nanosheets 104 and the nanosheets 106.

Figure 6:
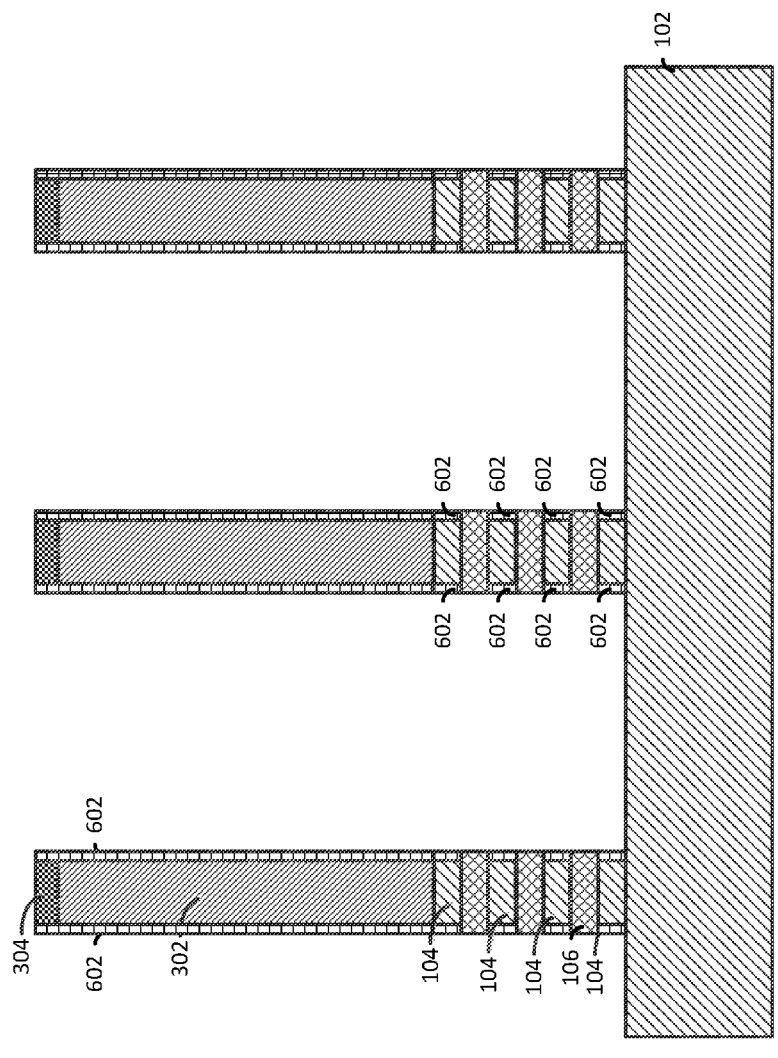
FIG. 6 illustrates a cut-away view following the formation of a sacrificial second spacer in the cavities (of FIG. 5).

FIG. 6 illustrates a cut-away view following the formation of a sacrificial second spacer 602 in the cavities 501 (of FIG. 5). The second spacer 602 can include any suitable spacer material that can be deposited conformally in the cavities 501.

Figure 7:
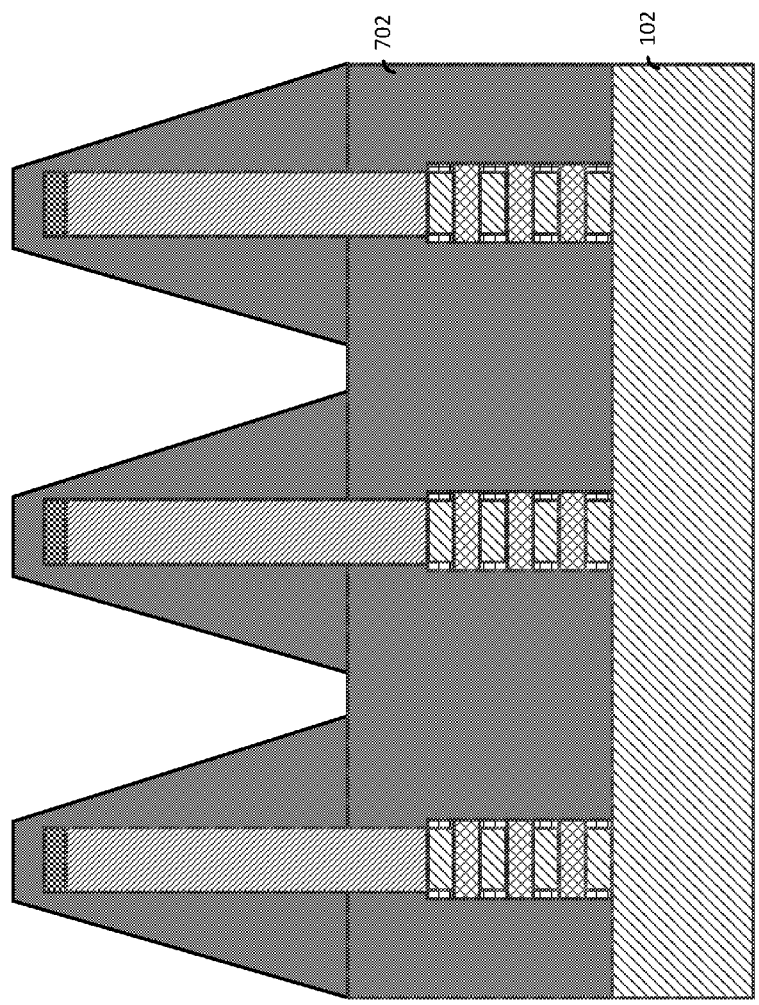
FIG. 7 illustrates a cut-away view following the removal of portions of the second spacer and the deposition of a low-k dielectric material over the sacrificial gates and the substrate.

FIG. 7 illustrates a cut-away view following the removal of portions of the second spacer 602 and the deposition of a dielectric material 702 over the sacrificial gates 302 and the substrate 102. The dielectric material 702 can include, for example, silicon oxide, silicon nitride, silicon oxynitride, SiOCN or SiBCN material.

Figure 8:
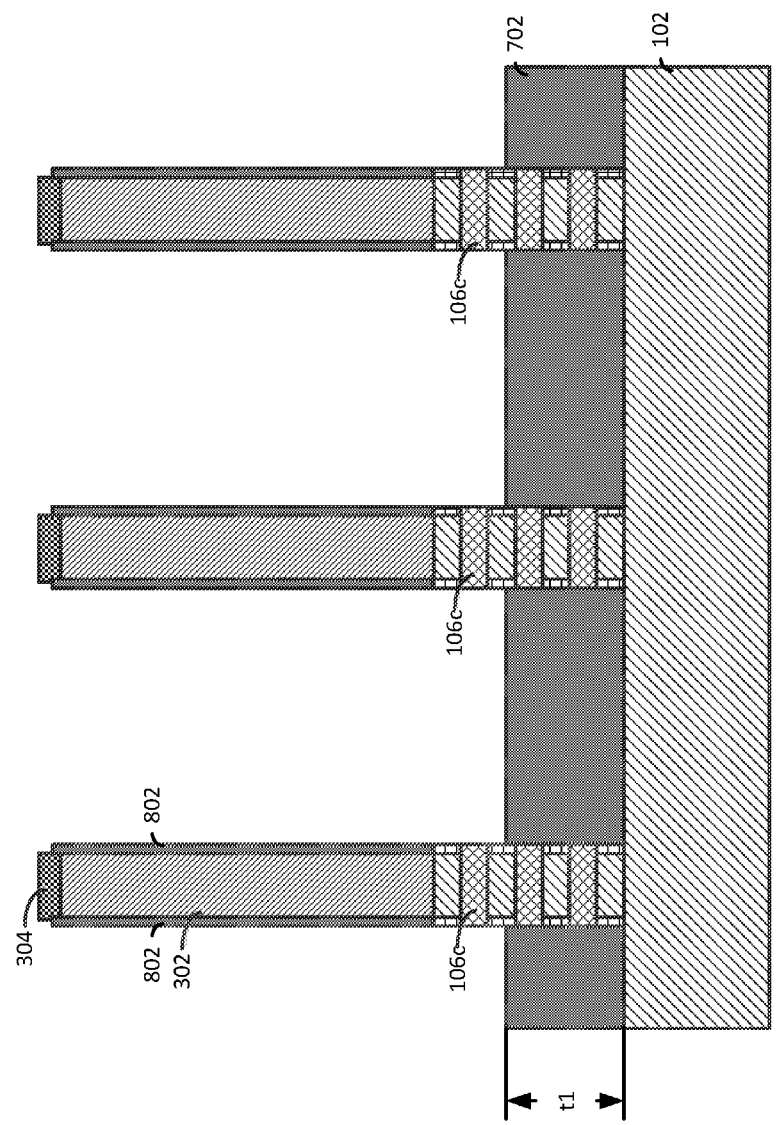
FIG. 8 illustrates a cut-away view following a directional etching process that removes portions of the low-k dielectric material to form spacers adjacent to the sacrificial gates.

FIG. 8 illustrates a cut-away view following a directional etching process that removes portions of the low-k dielectric material 702 to form spacers 802 adjacent to the sacrificial gates 302. The etching process is controlled such that the dielectric material 702 is reduced to a first thickness (t1) that exposes the nanosheets 106c.

Figure 9:
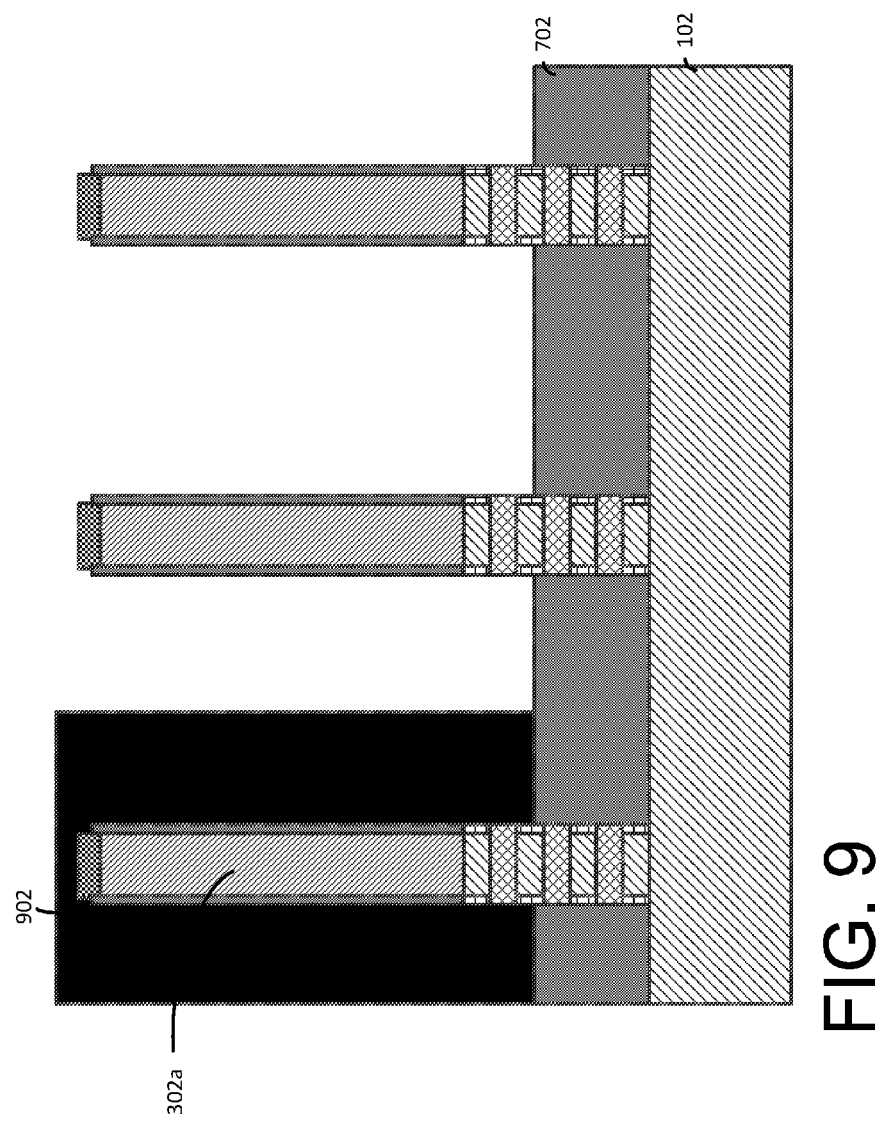
FIG. 9 illustrates a cut-away view following the patterning of a first mask over the first sacrificial gate.

FIG. 9 illustrates a cut-away view following the patterning of a first mask 902 over the first sacrificial gate 304a. Suitable masks include photoresists, electron-beam resists, ion-beam resists, X-ray resists, optical planarization layers, and etch resists. The resist can a polymeric spin on material or a polymeric material.

Figure 10:
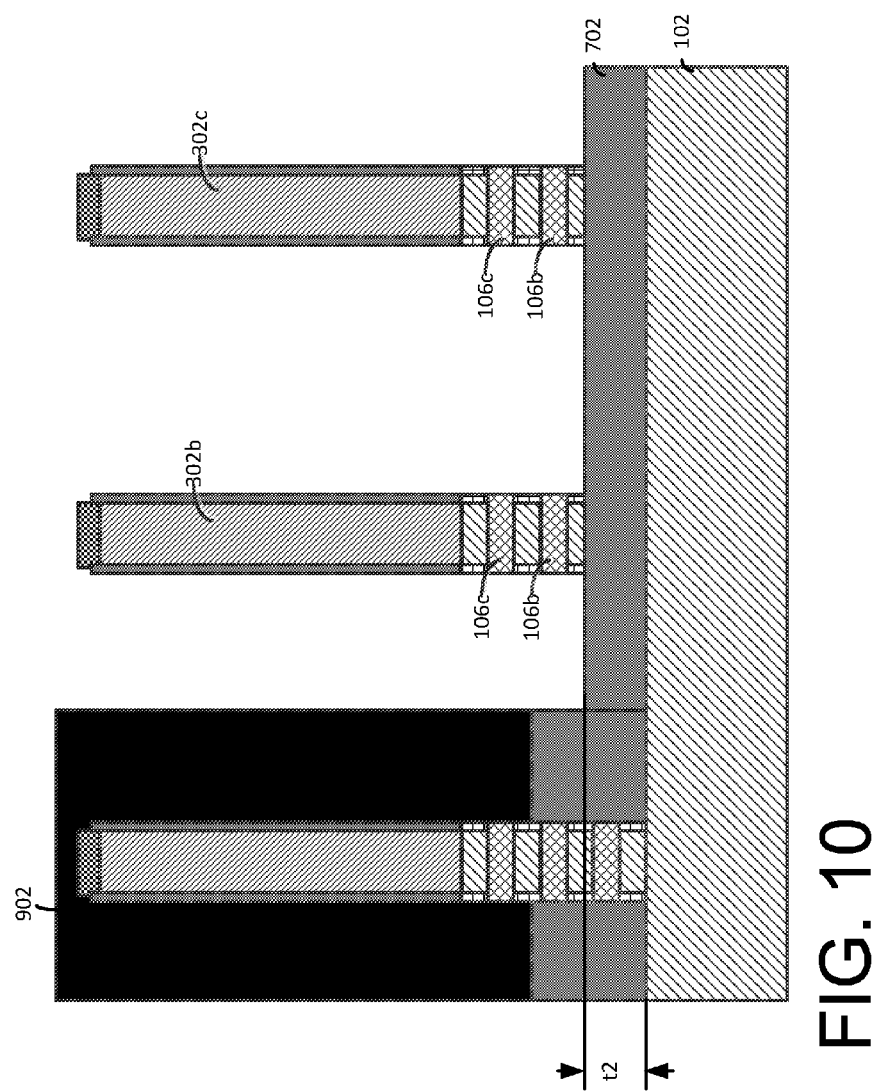
FIG. 10 illustrates a cut-away view following an etching process that removes exposed portions of the low-k dielectric layer to reduce the thickness of exposed portions of the low-k dielectric layer to a second thickness.

FIG. 10 illustrates a cut-away view following an etching process that removes exposed portions of the low-k dielectric layer 702 to reduce the thickness of exposed portions of the low-k dielectric layer 702 to a second thickness (t2) where t1>t2. The reduction of the thickness of the low-k dielectric layer 702 results in the exposure of the nanosheets 106b below the sacrificial gates 302b and 302c.

Figure 11:
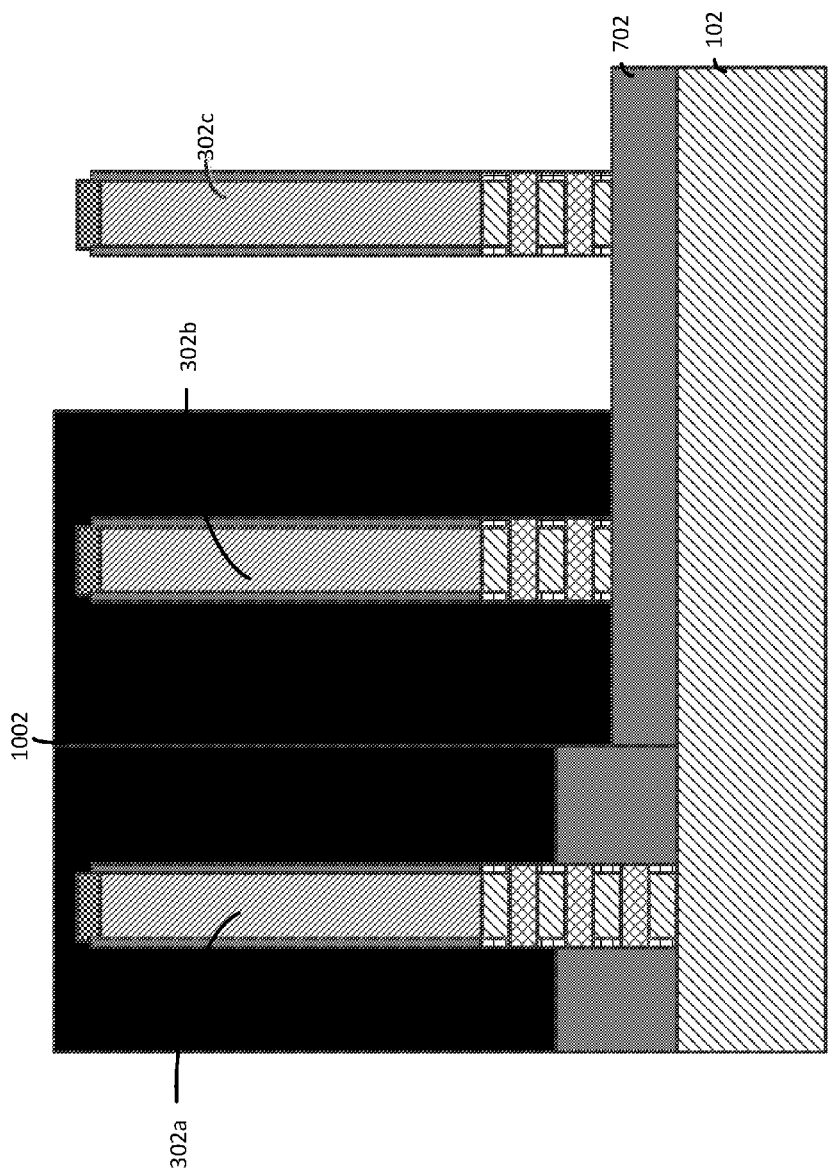
FIG. 11 illustrates a cut-away view following the patterning of a second mask 1002 over the first sacrificial gate and the second sacrificial gate.

FIG. 11 illustrates a cut-away view following the patterning of a second mask 1002 over the first sacrificial gate 302a and the second sacrificial gate 302b.

Figure 12:
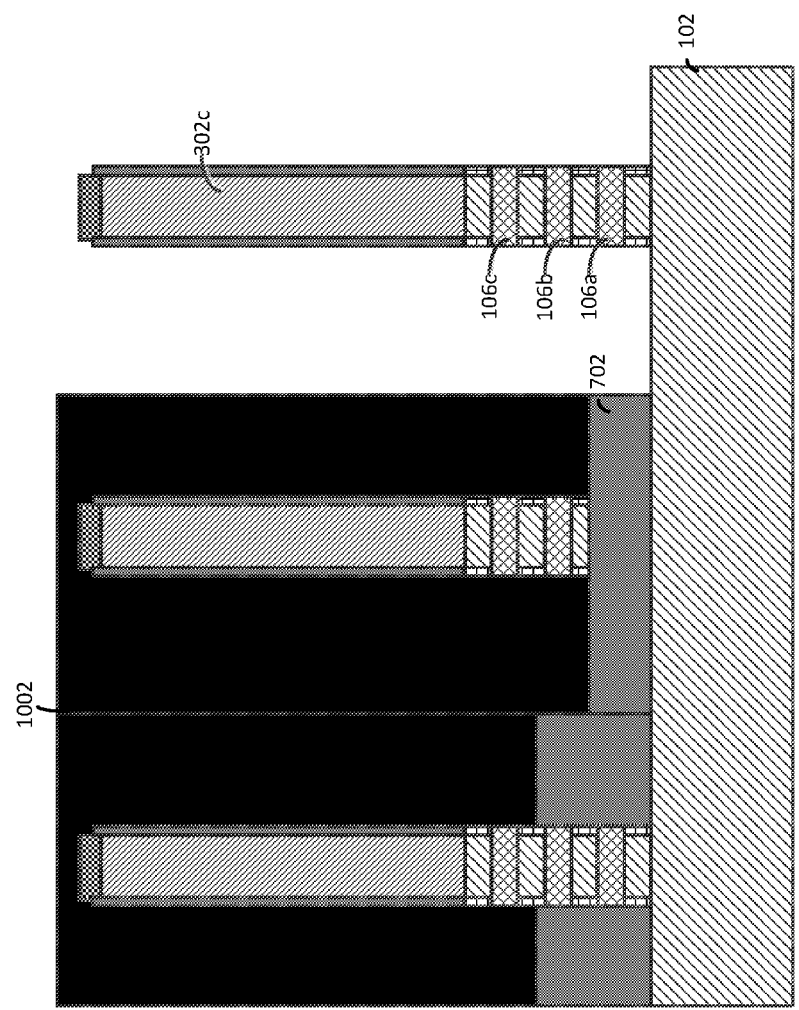
FIG. 12 illustrates a cut-away view following an etching process that removes exposed portions of the low-k dielectric layer to reduce the thickness of exposed portions of the low-k dielectric layer to expose the substrate.

FIG. 12 illustrates a cut-away view following an etching process that removes exposed portions of the low-k dielectric layer 702 to reduce the thickness of exposed portions of the low-k dielectric layer 702 to expose the substrate 102. The resultant structure exposes the nanosheet 106a below the third sacrificial gate 302c.

Figure 13:
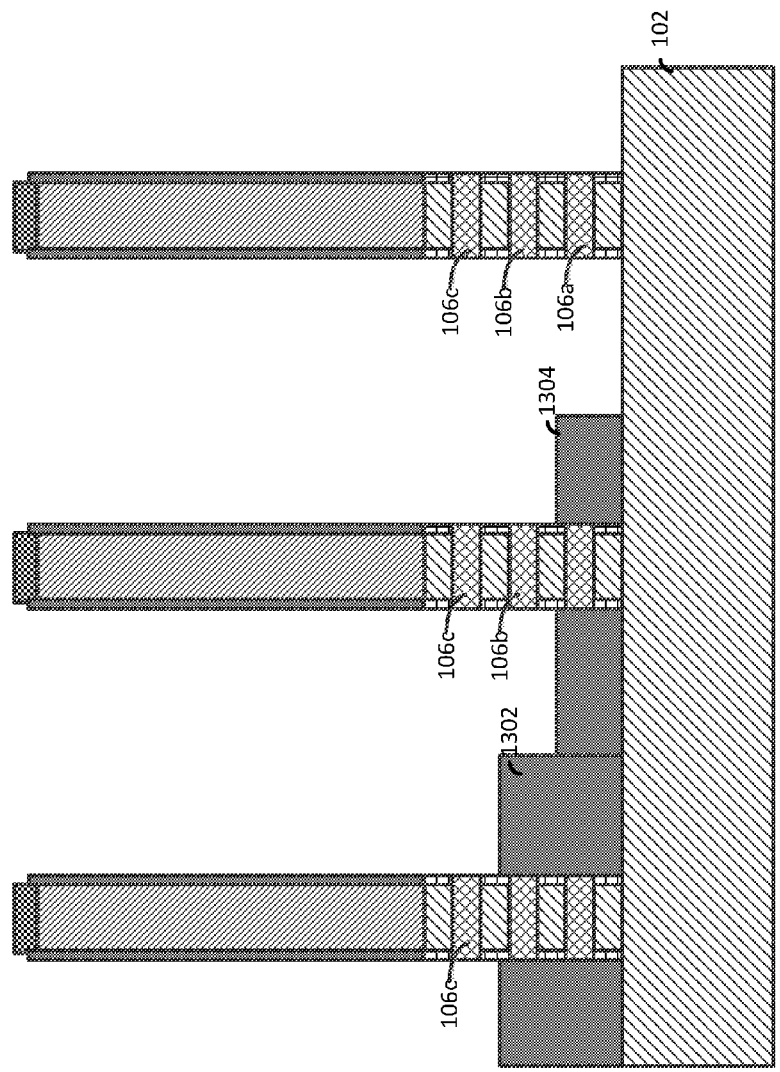
FIG. 13 illustrates a cut-away view following the removal of the masks.

FIG. 13 illustrates a cut-away view following the removal of the masks 902 and/or 1002, by for example, ashing. The ashing process can be used to remove a photoresist material, amorphous carbon, or organic planarization (OPL) layer. Ashing is performed using a suitable reaction gas, for example, $O_2$, $N_2$, H2/N2, $O_3$, $CF_4$, or any combination thereof.

Figure 14:
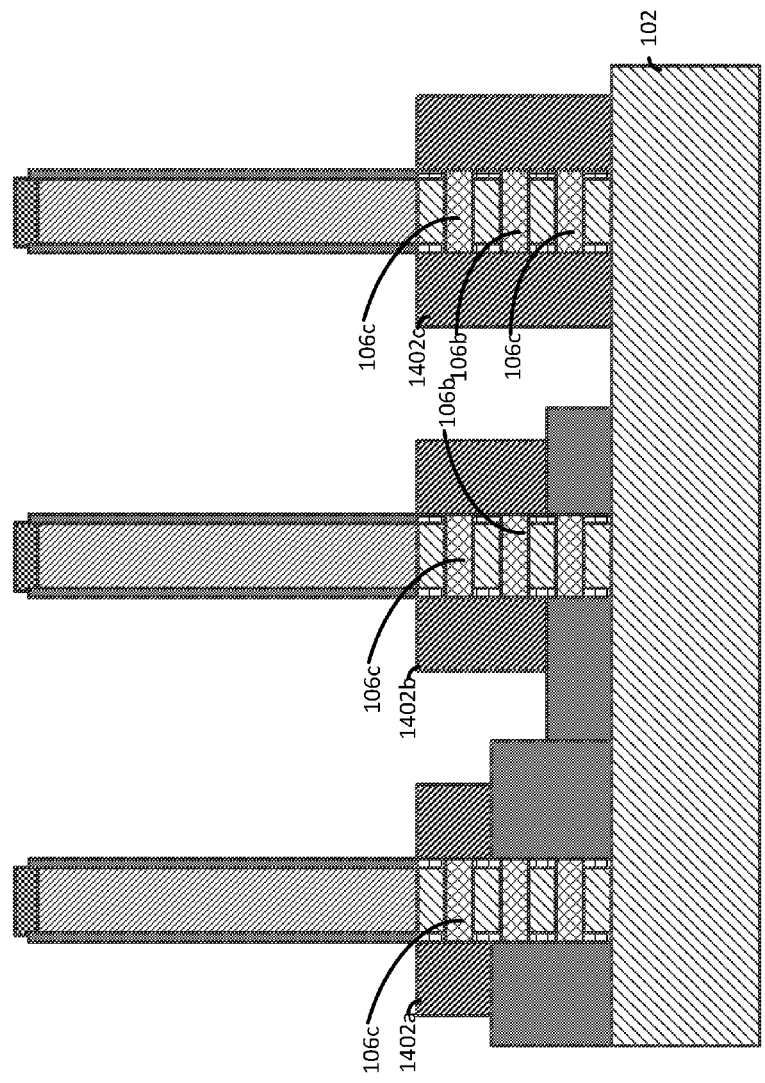
FIG. 14 illustrates a cut-away view following the formation of source/drain regions.

FIG. 14 illustrates a cut-away view following the formation of source/drain regions 1402a, 1402b and 1402c. The source/drain regions 1402a, 1402b and 1402c are formed by an epitaxial growth process that deposits a crystalline overlayer of semiconductor material onto the exposed crystalline seed material of the exposed fin 202 to form the source/drain regions 1402a, 1402b and 1402c.

Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1\times10^{19}$ cm$^{-3}$ to $2\times10^{21}$ cm$^{-3}$, or between $2\times10^{20}$ cm$^{-3}$ and $1\times10^{21}$ cm$^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 15:
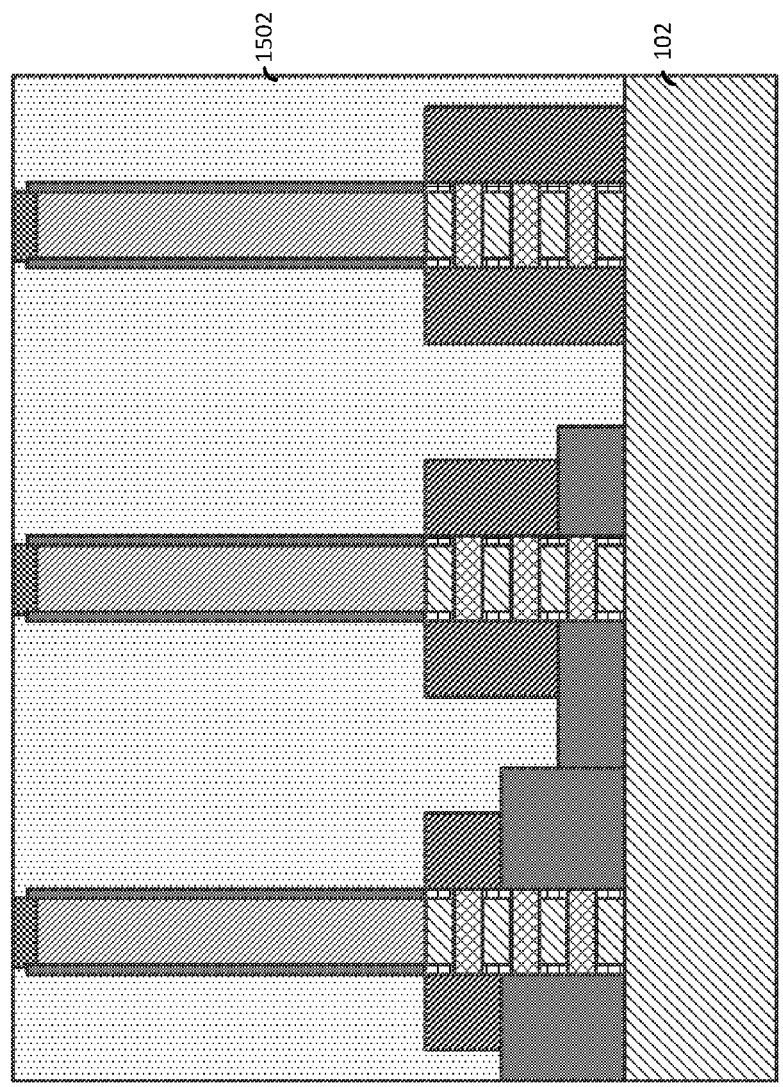
FIG. 15 illustrates a cut-away view following the formation of an inter-level dielectric layer 1502 over the source/drain regions.

FIG. 15 illustrates a cut-away view following the formation of an inter-level dielectric layer 1502 over the source/drain regions 1402a, 1402b and 1402c.

The inter-level dielectric layer 1502 is formed from, for example, a low-k dielectric material (with k<4.0), including but not limited to, silicon oxide, spin-on-glass, a flowable oxide, a high density plasma oxide, borophosphosilicate glass (BPSG), or any combination thereof. The inter-level dielectric layer 1502 is deposited by a deposition process, including, but not limited to CVD, PVD, plasma enhanced CVD, atomic layer deposition (ALD), evaporation, chemical solution deposition, or like processes. Following the deposition of the inter-level dielectric layer 1502, a planarization process such as, for example, chemical mechanical polishing is performed.

Figure 16:
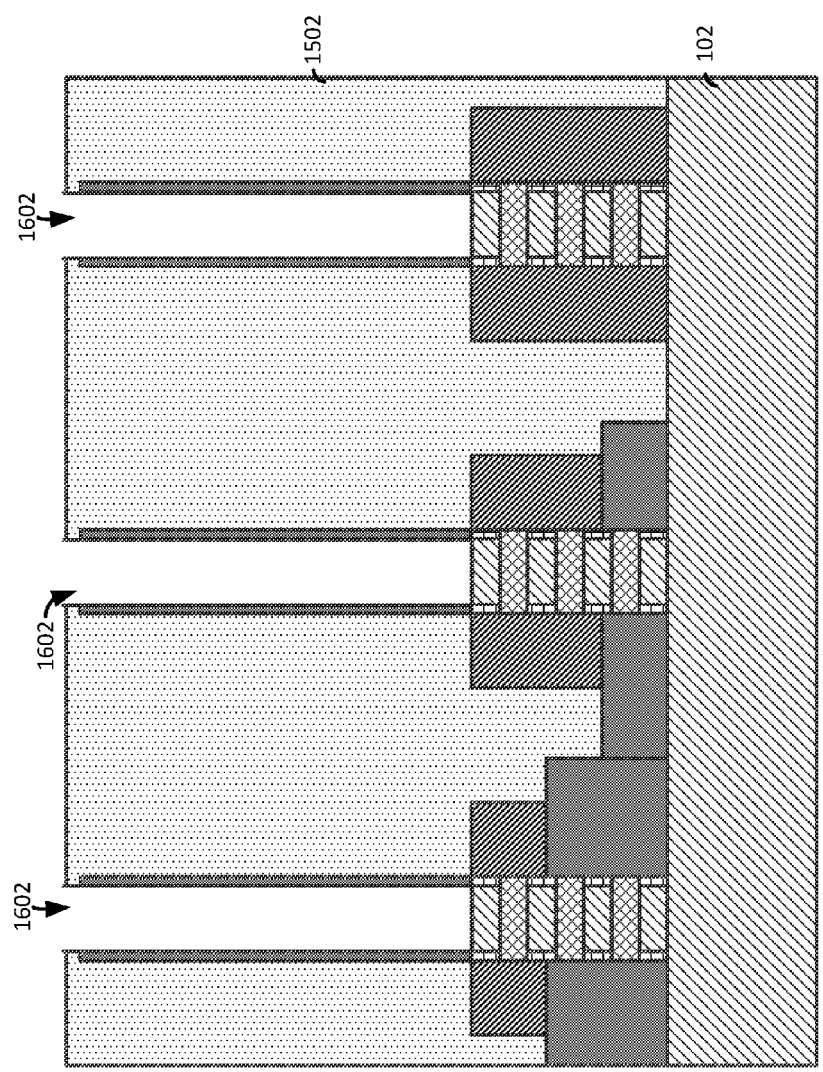
FIG. 16 illustrates a cut-away view flowing the removal of the sacrificial gates (of FIG. 15) to form cavities that expose the channel regions of the fins.

FIG. 16 illustrates a cut-away view flowing the removal of the sacrificial gates 302 (of FIG. 15) to form cavities 1602 that expose the channel regions of the fins 202. The sacrificial gates 302 can be removed by performing a dry etch process, for example, RIE, followed by a wet etch process. The wet etch process is selective to (will not substantially etch) the spacers 306 and the inter-level dielectric material 1502. The chemical etch process can include, but is not limited to, hot ammonia or tetramethylammonium hydroxide (TMAH).

Figure 17:
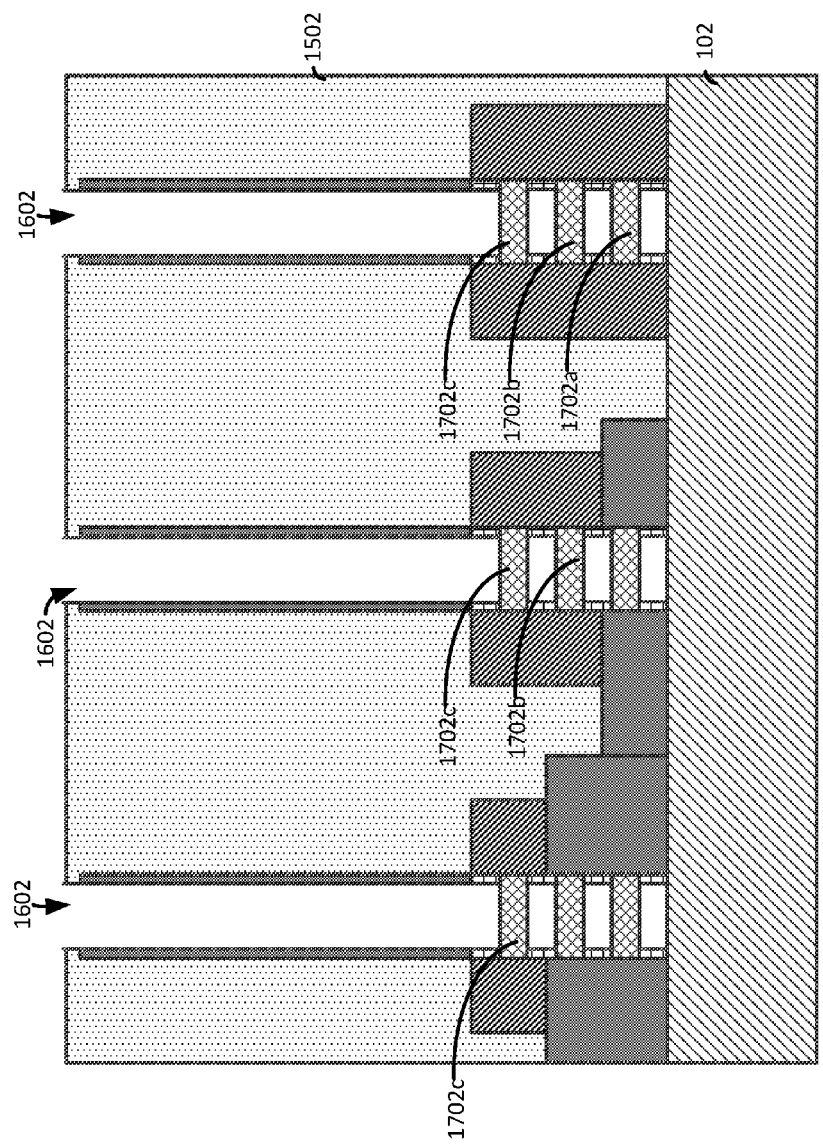
FIG. 17 illustrates a cut-away view following the removal of the exposed nanosheets.

FIG. 17 illustrates a cut-away view following the removal of the exposed nanosheets 104. The nanosheets 104 can be removed, by a selective etching process. The nanosheets 104 can be etched selective to SiGe, for example, by an aqueous etchant containing ammonia. The removal of the nanosheets 104 forms nanowires 1702.

Figure 18:
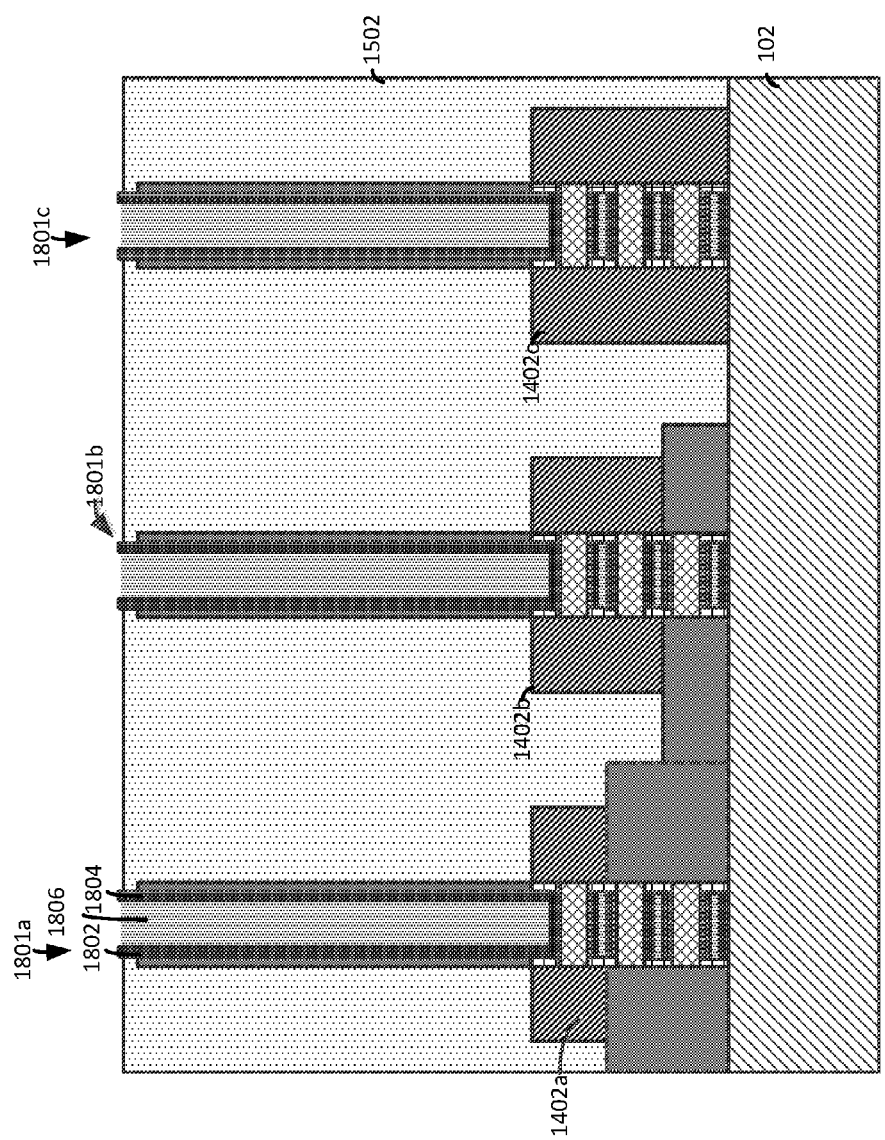
FIG. 18 illustrates a cut-away view following the formation of a replacement metal gate stack (gate stacks).

FIG. 18 illustrates a cut-away view following the formation of a replacement metal gate stack (gate stacks) 1801a, 1801b, and 1801c. The gate stacks 1801a, 1801b, and 1801c include high-k metal gates formed, for example, by filling the cavity 1602 (of FIG. 17) with one or more gate dielectric 1802 materials, one or more workfunction metals 1804, and one or more metal gate conductor 1806 materials. The gate dielectric 1802 material(s) can be a dielectric material having a dielectric constant greater than 3.9, 7.0, or 10.0. Non-limiting examples of suitable materials for the dielectric 1802 materials include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum.

The gate dielectric 1802 materials can be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material can vary depending on the deposition process as well as the composition and number of high-k dielectric materials used. The dielectric material layer can have a thickness in a range from about 0.5 to about 2 nm, although greater or lesser thickness can also be employed.

The work function metal(s) 1804 can be disposed over the gate dielectric 1802 material. The type of work function metal(s) 1804 depends on the type of transistor and can differ between the nFET and pFET devices. Non-limiting examples of suitable work function metals 1804 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) can be deposited by a suitable deposition process, for example, CVD, PECVD, PVD, plating, thermal or e-beam evaporation, and sputtering.

The gate conductor 1806 material(s) is deposited over the gate dielectric 1802 materials and work function metal(s) 1804 to form the gate stacks 1801a, 1801b, and 1801c. Non-limiting examples of suitable conductive metals include aluminum (Al), platinum (Pt), gold (Au), tungsten (W), titanium (Ti), or any combination thereof. The gate conductor 1806 material(s) can be deposited by a suitable deposition process, for example, CVD, PECVD, PVD, plating, thermal or e-beam evaporation, and sputtering.

Following the deposition of the gate dielectric 1802 materials, the work function metal(s) 1804, and the gate conductor 1806 material(s), planarization process, for example, chemical mechanical planarization (CMP), is performed to remove the overburden of the deposited gate materials and form the gate stacks 1801a, 1801b, and 1801c.

The resultant gate stacks 1801a, 1801b, and 1802c are formed around nanowires 1702. The source/drain regions 1402a, 1402b, and 1402c have different thicknesses thus the gate stack 1801a is formed around the nanowires 1702, however gate stack 1801a is formed around one nanowire 1702 that is connected to the source/drain regions 1402a. The gate stack 1801b is formed around the nanowires 1702, but the gate stack 1801b is formed around two nanowires 1702 that are connected to the source/drain regions 1402b. The gate stack 1801c is formed around three nanowires 1702 that are connected to the source/drain regions 1402c. Thus, the performance characteristics of each of the devices is different due to the differences in the effective channel widths of the gate stacks 1801a, 1801b, and 1802c.

After the gate stack 1801a, 1801b, and 1801c is formed, additional insulating material (not shown) can be deposited over the device(s). The insulating material can be patterned to form cavities (not shown) that expose portions of the source/drain regions 1402*a*, 1402*b* and 1402*c* and the gate stack 1801*a*, 1801*b*, and 1801*c*. The cavities can be filled by a conductive material (not shown) and, in some embodiments, a liner layer (not shown) to form conductive contacts (not shown).

The conductive material can include any suitable conductive material including, for example, polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition.

As used herein, the terms "invention" or "present invention" are non-limiting terms and not intended to refer to any single aspect of the particular invention but encompass all possible aspects as described in the specification and the claims. The term "on" can refer to an element that is on, above or in contact with another element or feature described in the specification and/or illustrated in the figures.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" "on and in direct contact with" another element, there are no intervening elements present, and the element is in contact with another element.

It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
   forming a stack of nanowires/nano sheets on a substrate, the stack of nano sheets comprising
   a first layer of a first nanosheet material arranged on the substrate and a second layer of a second nanosheet material arranged on the first layer, a third layer of the first nanosheet material arranged on the second layer, and a fourth layer of the second nanosheet material arranged on the third layer;
   removing portions of the stack of nanosheets to form a nanosheet fin on the substrate;
   forming a first sacrificial gate on a first channel region of the nanosheet fin and a second sacrificial gate on a second channel region of the nanosheet fin;
   forming a first sacrificial spacer along sidewalls of the first sacrificial gate and the second sacrificial gate;
   removing exposed portions of the nanosheet fin;
   removing portions of the first nanosheet material to form cavities in the nanosheet fin;
   filling the cavities with a second sacrificial spacer;
   removing the first sacrificial spacer from along the sidewalls of the first sacrificial gate and the second sacrificial gate;
   depositing an insulator material over the substrate and the sidewalls of the first sacrificial gate and the second sacrificial gate;
   removing portions of the insulator material to form a spacer adjacent to sidewalls of the first sacrificial gate and the second sacrificial gate, and to expose fourth layer and the third layer;
   removing additional portions of the insulator material to expose portions of the second layer and the first layer, wherein the exposed portion of the second layer and the first layer are arranged under the second sacrificial gate;
   forming source/drain regions adjacent to the first sacrificial gate and the second sacrificial gate; and
   forming a gate stack over the first channel region and the second channel region.

2. The method of claim 1,
   wherein the forming the gate stack over the first channel region and the second channel region includes:
   removing the first sacrificial gate and the second sacrificial gate;
   etching to remove the exposed portions of the first layer and the third layer to form a first nanowire in the first channel region, and a first nanowire and a second nanowire in the second channel region;
   forming a first gate stack around the first nanowire; and
   forming a second gate stack around the first nanowire and the second nanowire.

3. The method of claim 1, further comprising depositing a layer of insulator material over the source/drain regions prior to forming the gate stack.

4. The method of claim 1, further comprising patterning a mask over the first sacrificial gate prior to removing the portions of the insulator material to expose the third layer, the second layer, and the first layer arranged under the second sacrificial gate.

5. The method of claim 1, wherein the first nanosheet material includes a first semiconductor material and the second nanosheet material includes a second semiconductor material, the first semiconductor material is dissimilar to the second semiconductor material.

6. The method of claim 1, wherein the first nanosheet material includes a silicon material and the second nanosheet material includes a silicon germanium material.

7. The method of claim 1, wherein the removing portions of the first nanosheet material to form cavities in the nanosheet fin includes performing an isotropic etching process.

8. The method of claim 1, further comprising forming a cap layer over the first sacrificial gate and the second sacrificial gate prior to forming the first sacrificial spacer.

9. A method for forming a semiconductor device, the method comprising:
    forming a stack of nanosheets on a substrate, the stack of nanosheets comprising a first layer of a first nanosheet material arranged on the substrate and a second layer of a second nanosheet material arranged on the first layer, a third layer of the first nanosheet material arranged on the second layer, a fourth layer of the second nanosheet material arranged on the third layer, a fifth layer of the first nanosheet material arranged on the fourth layer and a sixth layer of the second nanosheet material arranged on the fifth layer
    removing portions of the stack of nanosheets to form a nanosheet fin on the substrate;
    forming a first sacrificial gate on a first channel region of the nanosheet fin, a second sacrificial gate on a second channel region of the nanosheet fin, and a third sacrificial gate on a third channel region of the nanosheet fin;
    forming a first sacrificial spacer along sidewalls of the first sacrificial gate, the second sacrificial gate, and the third sacrificial gate;
    removing exposed portions of the nanosheet fin;
    removing portions of the first nanosheet material to form cavities in the nanosheet fin;
    filling the cavities with a second sacrificial spacer;
    removing the first sacrificial spacer from along the sidewalls of the first sacrificial gate, the second sacrificial gate, and the third sacrificial gate;
    depositing an insulator material over the substrate and the sidewalls of the first sacrificial gate, the second sacrificial gate, and the third sacrificial gate;
    removing portions of the insulator material to form a spacer adjacent to sidewalls of the first sacrificial gate, the second sacrificial gate, and the third sacrificial gate, and to expose the sixth layer and the fifth layer;
    removing additional portions of the insulator material to expose portions of the fourth layer and the third layer, wherein the exposed portions of the fourth layer, and the third layer are arranged under the second sacrificial gate and the third sacrificial gate;
    removing additional portions of the insulator material to expose portions of the second layer and the first layer, wherein the exposed portions of the second layer and the first layer are arranged under the third sacrificial gate;
    forming source/drain regions adjacent to the first sacrificial gate, the second sacrificial gate, and the third sacrificial gate; and
    forming a gate stack over the first channel region, the second channel region, and the third channel region.

10. The method of claim 9, wherein the forming the gate stack over the first channel region and the second channel region includes:
    removing the first sacrificial gate and the second sacrificial gate;
    etching to remove the exposed portions of the first layer, the third layer, and the fifth layer to form a first nanowire in the first channel region, and a first nanowire and a second nanowire in the second channel region;
    forming a first gate stack around the first nanowire; and
    forming a second gate stack around the first nanowire and the second nanowire.

11. The method of claim 9, further comprising depositing a layer of insulator material over the source/drain regions prior to forming the gate stack.

12. The method of claim 9, further comprising patterning a mask over the first sacrificial gate prior to removing the portions of the insulator material to expose the third layer, the second layer, and the first layer arranged under the second sacrificial gate.

13. The method of claim 9, wherein the first nanosheet material includes a first semiconductor material and the second nanosheet material includes a second semiconductor material, the first semiconductor material is dissimilar to the second semiconductor material.

14. The method of claim 9, wherein the first nanosheet material includes a silicon material and the second nanosheet material includes a silicon germanium material.

15. The method of claim 9, wherein the removing portions of the first nanosheet material to form cavities in the nanosheet fin includes performing an isotropic etching process.

16. The method of claim 9, further comprising forming a cap layer over the first sacrificial gate and the second sacrificial gate prior to forming the first sacrificial spacer.

* * * * *